(12) United States Patent
Bauer et al.

(10) Patent No.: US 8,793,008 B2
(45) Date of Patent: Jul. 29, 2014

(54) METHOD FOR DETERMINING FITTINGS FOR CONSTANT TABLES OF AUTOMATIC PLACEMENT MACHINES

(75) Inventors: Petra Bauer, München (DE); Alexander Pfaffinger, München (DE); Christian Royer, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 382 days.

(21) Appl. No.: 13/256,714

(22) PCT Filed: Feb. 9, 2010

(86) PCT No.: PCT/EP2010/051566
§ 371 (c)(1), (2), (4) Date: Sep. 15, 2011

(87) PCT Pub. No.: WO2010/105876
PCT Pub. Date: Sep. 23, 2010

(65) Prior Publication Data
US 2012/0004762 A1    Jan. 5, 2012

(30) Foreign Application Priority Data

Mar. 16, 2009 (DE) .......... 10 2009 013 353

(51) Int. Cl.
*G06F 19/00* (2011.01)
*G06F 7/00* (2006.01)

(52) U.S. Cl.
USPC ........... 700/111; 700/213; 700/215; 700/218; 700/219; 700/221

(58) Field of Classification Search
None
See application file for complete search history.

(56) References Cited

U.S. PATENT DOCUMENTS

| 4,342,090 A | * | 7/1982 | Caccoma et al. | 716/118 |
| 4,475,642 A | * | 10/1984 | Fritz | 198/345.3 |
| 4,651,601 A | * | 3/1987 | Sasaki | 83/13 |
| 4,729,152 A | * | 3/1988 | Hammond et al. | 29/33 M |
| 4,844,680 A | * | 7/1989 | Kawata et al. | 414/331.17 |
| 4,873,623 A | * | 10/1989 | Lane et al. | 700/83 |

(Continued)

FOREIGN PATENT DOCUMENTS

| CN | 1502219 A | 6/2004 | H05K 13/02 |
| DE | 19838595 A1 | 3/2000 | H05K 13/02 |

(Continued)

OTHER PUBLICATIONS

Chun et al., "A Methodology for Product Mix Planning in Semiconductor Foundry Manufacturing", IEEE, 2000, pp. 278-285.*

(Continued)

*Primary Examiner* — Kavita Padmanabhan
*Assistant Examiner* — Thomas Stevens
(74) *Attorney, Agent, or Firm* — King & Spalding L.L.P.

(57) ABSTRACT

A method determines setups for constant tables of automatic placement machines in placement lines at predetermined table locations by mixed integer linear optimization based on input data describing the placement infrastructure and input parameters that can be specified by the operator or user. The method can be used regardless of the mounting technique used (for example, plug in mounting technique, surface mounting technique, or a hybrid technique). The method can be advantageously used with other methods, for example, cluster methods for forming setup groups or line balancing for cycle time optimization.

20 Claims, 1 Drawing Sheet

(56) References Cited

U.S. PATENT DOCUMENTS

| | | | |
|---|---|---|---|
| 4,937,511 A * | 6/1990 | Herndon et al. | 318/568.21 |
| 4,967,381 A * | 10/1990 | Lane et al. | 702/81 |
| 5,170,554 A | 12/1992 | Davis et al. | 29/832 |
| 5,196,773 A * | 3/1993 | Yoshikawa et al. | 318/561 |
| 5,201,804 A * | 4/1993 | Hisajima | 108/90 |
| 5,258,915 A | 11/1993 | Billington et al. | 700/103 |
| 5,302,209 A * | 4/1994 | Maeda et al. | 118/719 |
| 5,422,316 A * | 6/1995 | Desai et al. | 438/693 |
| 5,443,534 A * | 8/1995 | Vinciarelli et al. | 29/593 |
| 5,715,267 A * | 2/1998 | Iwase | 372/46.01 |
| 5,740,034 A * | 4/1998 | Saeki | 700/59 |
| 5,753,879 A * | 5/1998 | Yang et al. | 219/69.12 |
| 5,759,006 A * | 6/1998 | Miyamoto et al. | 414/416.01 |
| 5,761,064 A * | 6/1998 | La et al. | 700/110 |
| 5,829,948 A * | 11/1998 | Becklund | 414/607 |
| 6,045,315 A * | 4/2000 | Azumano et al. | 414/217 |
| 6,346,682 B2 * | 2/2002 | Kim et al. | 209/573 |
| 6,356,797 B1 * | 3/2002 | Hsieh et al. | 700/110 |
| 6,434,440 B1 * | 8/2002 | Teranishi et al. | 700/97 |
| 6,678,947 B1 | 1/2004 | Bauer et al. | 29/832 |
| 6,713,903 B2 * | 3/2004 | Widdowson et al. | 310/12.32 |
| 6,829,514 B2 * | 12/2004 | Gyorfi et al. | 700/99 |
| 6,960,257 B2 * | 11/2005 | Thompson et al. | 118/52 |
| 7,036,702 B2 | 5/2006 | Liebeke | 226/139 |
| 7,080,652 B2 * | 7/2006 | Davis et al. | 134/133 |
| 7,135,353 B2 * | 11/2006 | Kim et al. | 438/109 |
| 7,153,365 B2 * | 12/2006 | Aoki | 118/500 |
| 7,257,459 B1 * | 8/2007 | Qu | 700/121 |
| 7,408,338 B2 * | 8/2008 | Ham et al. | 324/757.01 |
| 8,026,735 B2 * | 9/2011 | Shim et al. | 324/756.07 |
| 8,101,436 B2 * | 1/2012 | Takekoshi | 438/18 |
| 8,121,818 B2 * | 2/2012 | Gorinevsky | 702/183 |
| 8,151,448 B2 * | 4/2012 | Vermeer et al. | 29/739 |
| 2001/0014836 A1 * | 8/2001 | Tamaki et al. | 700/99 |
| 2001/0038295 A1 * | 11/2001 | Kim et al. | 324/765 |
| 2002/0060464 A1 * | 5/2002 | Bendat et al. | 294/64.1 |
| 2002/0066693 A1 * | 6/2002 | Zhu et al. | 206/725 |
| 2002/0107599 A1 * | 8/2002 | Patel et al. | 700/99 |
| 2003/0085160 A1 * | 5/2003 | Shim et al. | 209/573 |
| 2003/0119214 A1 * | 6/2003 | Kitazawa et al. | 438/5 |
| 2003/0155415 A1 * | 8/2003 | Markham et al. | 235/376 |
| 2003/0221144 A1 * | 11/2003 | Shimada et al. | 714/710 |
| 2003/0231791 A1 * | 12/2003 | Torre-Bueno et al. | 382/133 |
| 2004/0073322 A1 * | 4/2004 | Maenishi et al. | 700/28 |
| 2004/0143352 A1 * | 7/2004 | Gyorfi et al. | 700/99 |
| 2005/0267836 A1 * | 12/2005 | Crosthwaite et al. | 705/37 |
| 2006/0096395 A1 * | 5/2006 | Weiss et al. | 73/865.9 |
| 2006/0119345 A1 * | 6/2006 | Ham et al. | 324/158.1 |
| 2006/0214655 A1 * | 9/2006 | Ham et al. | 324/158.1 |
| 2006/0228195 A1 * | 10/2006 | Hayashida et al. | 414/217 |
| 2007/0146656 A1 * | 6/2007 | Van Empel | 355/30 |
| 2007/0152655 A1 * | 7/2007 | Ham et al. | 324/158.1 |
| 2007/0176620 A1 * | 8/2007 | Shim et al. | 324/765 |
| 2007/0221548 A1 * | 9/2007 | Song et al. | 209/543 |
| 2008/0110809 A1 * | 5/2008 | Kang et al. | 209/573 |
| 2012/0004762 A1 | 1/2012 | Bauer et al. | 700/219 |

FOREIGN PATENT DOCUMENTS

| | | | | |
|---|---|---|---|---|
| EP | 0727924 A2 | 8/1996 | | H05K 1/02 |
| EP | 1374657 A | 1/2004 | | |
| JP | 4246897 A | 9/1992 | | H05K 13/04 |
| JP | 4257968 A | 9/1992 | | B65G 61/00 |
| JP | 09107197 A | 4/1997 | | H05K 13/02 |
| JP | 11054991 A | 2/1999 | | H05K 13/02 |
| JP | 11177281 A | 7/1999 | | H05K 13/02 |
| JP | 2002314292 A | 10/2002 | | H05K 13/02 |
| WO | 02/080643 A1 | 10/2002 | | H05K 13/04 |
| WO | 2010/105876 A1 | 9/2010 | | H05K 13/00 |

OTHER PUBLICATIONS

Herrmann et al., "Design of Material Flow Networks in Manufacturing Facilities" Elsevier, 1995, pp. 277-289.*

Karimi et al., "An Improved MILP Formation for Scheduling an Automated Wet-etch Station", Process Systems Engineering, 2003, pp. 1181-1186.*

Bhushan et al.,"An MILP Approach to Automated Wet-Etch Station Scheduling", Ind Eng, Chem, National University of Singapore, 2003, pp. 1391-1399.*

Benichou et al., "Experiments in Mixed—Integer Linear Programming", IBM, 1971, pp. 70-94.*

Csaszar et al., "Optimization of Automated High-Speed Modular Placement Machines Using Knowledge-Based Systems", IEEE, 2000, pp. 408-417.*

International PCT Search Report and Written Opinion, PCT/EP2010/051566, 13 pages, Jun. 18, 2010.

* cited by examiner

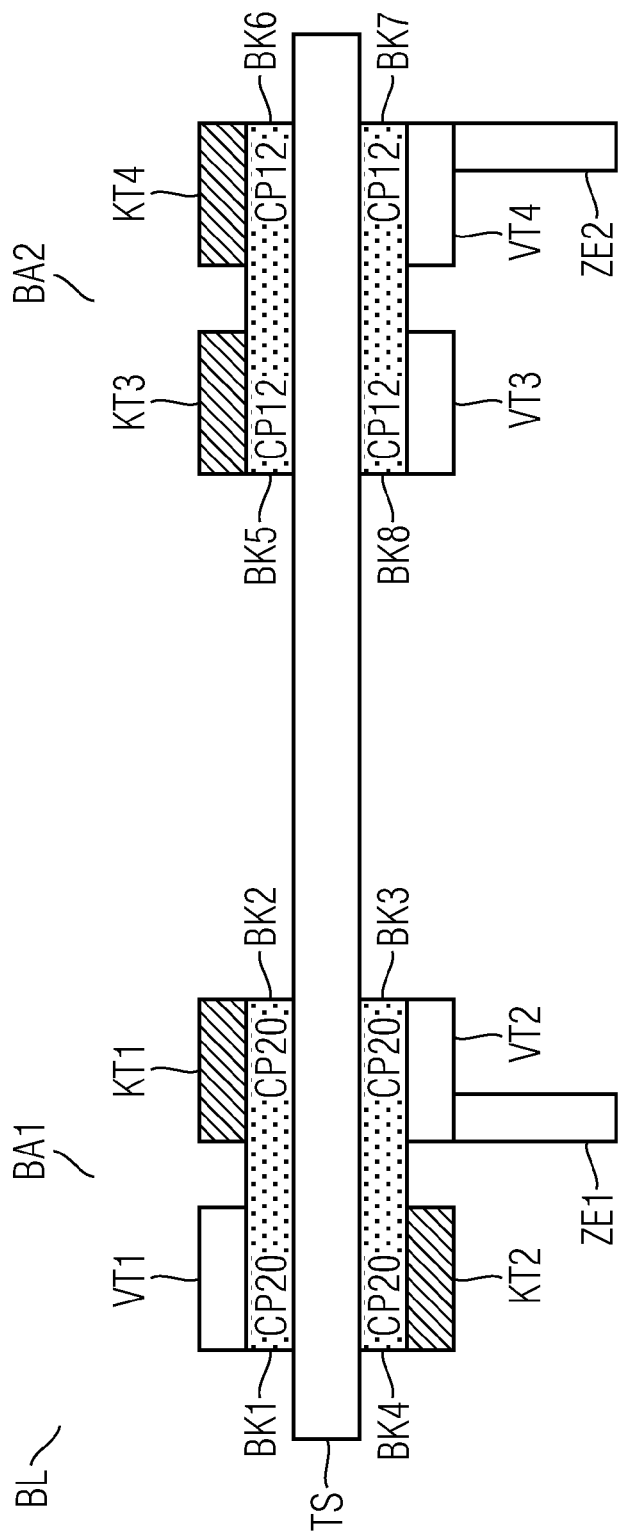

METHOD FOR DETERMINING FITTINGS FOR CONSTANT TABLES OF AUTOMATIC PLACEMENT MACHINES

CROSS-REFERENCE TO RELATED APPLICATIONS

This application is a U.S. National Stage Application of International Application No. PCT/EP2010/051566 filed Feb. 9, 2010, which designates the United States of America, and claims priority to German Application No. 10 2009 013 353.4 filed Mar. 16, 2009, the contents of which are hereby incorporated by reference in their entirety.

TECHNICAL FIELD

The invention relates to method for determining setups for constant tables of automatic placement machines in placement lines at predefined table locations, whereby the setups of the constant tables are used in all setup groups, whereby a setup group comprises a set of lots which are manufactured within a setup.

The invention furthermore relates to an automatic placement machine, comprising a constant table, the setup of which can be determined by the method according to various embodiments.

BACKGROUND

A plurality of automatic placement machines, which are normally linked by means of a transport system and which for example interact for the manufacture of electronic parts, constitute a placement line.

With regard to automatic placement machines, for example for equipping substrates with components, feed devices for components are arranged to the side on a transport path for the substrates. A placement head, which can be moved by means of a positioning system, of the automatic placement machine picks up the components from the feed devices, moves said components to a placement region of the automatic placement machine, in which the substrate to be equipped is supplied, and sets the components down on the substrate. So-called belt feeders for example which are suitable for the transportation and delivery of components mounted in belts are used for supplying the components. These transport the components loaded in pocket-like depressions to a pick-up position at which the components are picked up from the belt pockets by the placement head. The empty belt leaves the feed device at a suitable point. Such a feed device is known from EP 1374657 B1.

Furthermore, the grouping in setup groups of lots to be manufactured on a placement line is known for example from electronics manufacturing. All the lots of a setup group are manufactured in each case with the same line setup. Constant tables are tables installed in a fixed position in this situation and fitted in a fixed manner, which are identical for all the setups of the setup groups. The concept of constant tables reduces the changeover resource requirement and makes it possible to save on setup equipment.

Nowadays, the setups of the constant tables are ascertained by a production scheduler, in each case having an individual strategy based on the experience of the production scheduler and ascertained more or less by trial and error. The time requirement associated therewith is very high and the results are often not satisfactory.

The US patent specification U.S. Pat. No. 6,829,514 B2 discloses a method for achieving a balancing strategy based on mixed integer linear programming (MILP) in placement lines.

SUMMARY

According to various embodiments, a method for determining setups for constant tables of automatic placement machines can be provided in order to achieve an optimum throughput with as few setup groups as possible.

According to an embodiment in a method for determining setups for constant tables of automatic placement machines in placement lines at predefined table locations, the setups of the constant tables are used in all setup groups, whereby a setup group comprises a set of lots which are manufactured within a setup, wherein the setups for the constant tables are calculated by means of mixed integer linear optimization on the basis of input data and input parameters.

According to a further embodiment, the following data describing the placement infrastructure can be used as the input data for the calculation of the setups:
 tables with number of free tracks,
 locations of the constant tables,
 components with placement position numbers,
 maximum setup numbers per component,
 possible associations of components with tables,
 track requirements of the components on the tables,
 cycle times and placement position numbers per placement
   head in the result ascertained from a single lot optimization.

According to a further embodiment, a minimum cycle time limit can be predefined as a further input data item, describing the placement infrastructure, for the calculation of the setups. According to a further embodiment, the following parameters can be used as input parameters which can be predefined by the user for controlling the placement:
 the maximum filling level for the constant tables;
 the maximum filling level for variable tables;
 maximum number of permitted increases in the MaxSetup-Counts;
 optimization strategy of a user.

According to a further embodiment, the method may comprise the following step: Determination of setup groups based on the calculated setups for the constant tables. According to a further embodiment, the method may further comprise the following step: Determination of the setups for the remaining tables in the placement line for each setup group.

According to another embodiment, a computer software product may cause a method as described above to be carried out on a program-controlled facility.

According to yet another embodiment, a computer readable medium may comprise instructions which, when they are executed on a suitable computer, cause the computer to execute the method as described above.

According to yet another embodiment, an automatic placement machine may comprise a constant table, whereby the location of the constant table in a placement line is predefined, whereby the setups of the constant table are used in all the setup groups of the placement line, whereby a setup group includes a set of lots which are manufactured within the same setup, whereby the setups for the constant table are determined in accordance with a method as described above.

BRIEF DESCRIPTION OF THE DRAWINGS

An exemplary embodiment is illustrated in the drawing and will be described in the following.

In the drawings:

FIG. 1 shows an exemplary embodiment of a placement line having two automatic placement machines.

DETAILED DESCRIPTION

According to various embodiments, in a method of the type described in the introduction, the setups for the constant tables are calculated by means of mixed integer linear optimization on the basis of input data and input parameters. Constant tables are conveyor tables of production, manufacturing or assembly lines, which can remain stationary during a changeover operation and do not need to be changed. Constant tables thus contribute towards optimization of the manufacturing process because changeover resource requirements are reduced and savings can be made on setup equipment. The space and storage requirements are also reduced because fewer variable tables need to be held available (a variable table is understood to be an interchangeable or conveyor table, associated with a station side of an automatic placement machine, whereby the setups do not need to be constant for all setup groups but can vary, in other words can be altered. If necessary, variable tables must be interchanged.)

If the setups for the constant tables are calculated by means of mixed integer linear optimization (MILP), the setups can be determined on the one hand more quickly and on the other hand with a higher quality of results. A production scheduler does not therefore need to calculate the setups for constant tables manually (based on his experience) or by using simple spreadsheet programs (Excel for example), which as a general rule takes place by trial and error and is very time consuming. The mathematical calculation and optimization based on mixed integer linear optimization (MILP) for setups of constant tables yields better and faster results for the production scheduler.

A first embodiment consists in the fact that the following data, describing the placement infrastructure, is used as the input data for the calculation of the setups:
- tables with number of free tracks,
- locations of the constant tables,
- components with placement position numbers,
- maximum setup numbers per component,
- possible associations of components with tables,
- track requirements of the components on the tables,
- cycle times and placement position numbers per placement head in the result ascertained from a single lot optimization.

By this means, the setup of the constant tables to be calculated by means of mixed integer linear optimization can be optimized, dedicated to an existing placement infrastructure, because all the infrastructure parameters present are taken into consideration with regard to the calculation.

A further embodiment consists in the fact that a minimum cycle time limit is predefined as a further input data item, describing the placement infrastructure, for the calculation of the setups. This input data item makes it possible to take into account the fact that a particular cycle time must not be undershot (for example the kiln time).

A further embodiment consists in the fact that the following parameters are used as input parameters which can be predefined by the user for controlling the placement:
- the maximum filling level for the constant tables;
- the maximum filling level for variable tables;
- maximum number of permitted increases in the MaxSetupCounts;
- optimization strategy of a user.

By means of these input parameters it is possible for the user to specifically influence the placement method, as it is ultimately carried out during operation. The user can for example specify by means of the optimization strategy to be used whether more emphasis is to be placed on minimizing the number of clusters (in other words, of setup groups) as the target function or whether more emphasis is to be placed on minimizing the overall production time (throughput time) as the target function. This results in a high level of flexibility, which can be specifically influenced by the user, with respect to the production process.

A further embodiment consists in the execution of the method step:

Determination of setup groups based on the calculated setups for the constant tables. Based on the setups of the constant tables obtained by the mixed integer linear optimization, setup groups are determined which contain the lots to be manufactured, which are to be produced using the constant tables. The constant tables must be fitted such that all the predefined boards (printed circuit boards) are capable of being produced therewith. If this is not possible (which may well be the case for reasons of capacity for example), then an error message occurs.

A further optimization of the production process thus takes place. The setup of the constant tables can for example have the purpose that as few setup groups as possible are found.

A further embodiment consists in the execution of the method step:

Determination of the setups for the remaining tables in the placement line for each setup group. As a result, the setups for the remaining variable tables of a production line are determined. An overall optimization of a production line is thus possible.

A further embodiment consists in a computer software product or a computer readable medium which causes the method according to various embodiments described above to be carried out on a program-controlled facility (for example a computer or industrial PC). The method according to various embodiments can thus be carried out in computer-supported fashion and can be distributed as a product for example in the form of a program on a CD, DVD or other storage medium (for example a USB stick).

According to other embodiments, an automatic placement machine may comprise a constant table, whereby the location of the constant table in a placement line is predefined, whereby the setups of the constant table are used in all setup groups of the placement line, whereby a setup group includes a set of lots which are manufactured within the same setup, whereby the setups for the constant table are determined in accordance with a method as described above. Automatic placement machines which include constant tables having setups in accordance with the previously described method can be used in production lines, for example in order to save on changeovers.

FIG. 1 shows an exemplary embodiment of a placement line BL having two automatic placement machines BA1 and BA2 which are arranged on a transport system TS (for example conveyor belt).

The automatic placement machine BA1 consists of four conveyor tables KT1,KT2,VT1,VT2, of which two are variable tables VT1,VT2 and two are constant tables KT1,KT2. Furthermore, the automatic placement machine BA1 consists of four placement heads BK1-BK4 each of type CP20®. The placement heads BK1-BK8 of an automatic placement machine BA1, BA2 pick up the components from the feed devices ZE1,ZE2 and move said components to a placement region of the automatic placement machine BA1,BA2, where the substrate to be equipped (for example a base board in the case of SMD manufacturing) is supplied, and sets the components down on the substrate. The placement heads BK1-BK8 can normally be moved by means of a positioning system. So-called belt feeders can for example be used as feed devices ZE1,ZE2 for supplying the components.

Likewise arranged on the transport system TS, which supplies the base board, is the automatic placement machine BA2 having two variable tables VT3,VT4 and two constant tables KT3,KT4. Furthermore, the automatic placement machine BA2 consists of four placement heads BK5-BK8 each of type CP12®.

FIG. 1 illustrates by way of example that the variable tables VT2 and VT4 have feed devices ZE1 and ZE2 respectively, for supplying the components to be placed (for example chips, transistors etc.).

In order to equip printed circuit boards (substrate) in SMD manufacturing (for example for electronic components), automatic placement machines BA1,BA2 are used which place components from feed devices ZE1,ZE2 onto the printed circuit boards with the aid of a placement head BK1-BK8. The printed circuit boards (boards) are supplied at the automatic placement machines BA1,BA2 by the transport system TS.

Normally (for example in electronics manufacturing), the lots to be manufactured on a placement line are grouped in setup groups. All the lots of a setup group are manufactured in each case with the same line setup.

Constant tables KT1-KT4 are tables installed in a fixed position and fitted in a fixed manner, which are identical for all setups of the setup groups (clusters). The changeover resource requirement can thus be reduced and savings achieved on setup equipment.

A constant table KT1-KT4 is thus understood to be an interchangeable or conveyor table, associated with a station side of an automatic placement machine (location), which is associated with a placement line and a set B of lots (recipes) with corresponding quantities and the setup of which is the same for all clusters (in other words, setup groups) which contain only lots from B. For setups of the constant tables, components which are required in many lots are preferably chosen.

A variable table VT1-VT4 is understood to be an interchangeable or conveyor table, associated with a station side of an automatic placement machine, whereby the setups do not need to be constant for all setup groups but can vary, in other words can be altered. Variable tables VT1-VT4 must be interchanged if necessary. This signifies a changeover resource requirement. Furthermore, variable tables VT1-VT4 need to be held in readiness for interchanging, which generates a high demand for storage space.

A typical scenario (use case) in conjunction with constant tables KT1-KT4 is to determine for a given placement line a set of lots (recipes) with corresponding quantities and a given set of constant tables KT1-KT4, the setups of the constant tables KT1-KT4, a clustering of the given board type set and also the corresponding cluster setups. In this situation, the setups of the constant tables KT1-KT4 are taken into consideration with regard to formation of the clusters and their setups.

According to various embodiments, the setups for the constant tables KT1-KT4 can be calculated. The aim here is to determine these setups such that good results are achieved in respect of the number of clusters for the given lot set or in respect of the production times as a result of the subsequent method steps.

Mathematical Background

The method for determining the setups for the constant tables KT1-KT4 is based on the mathematical method of integer linear optimization (integer linear programming) or of mixed integer linear optimization (mixed integer linear programming, MILP). In integer linear optimization, the permissible solutions to the underlying problem are described by a set of variables (integer or continuous) which satisfy a set of linear inequations and equations. The target criterion is likewise formulated by means of a linear expression which is to be maximized or minimized.

Linear optimization is one of the main methods in the field of mathematical optimization and is concerned with the optimization of linear target functions over a set which is restricted by linear equations and inequations. It is the basis for the solution methods of (mixed) integer linear optimization.

A solver (advantageously implemented as a computer program) for integer linear optimization problems calculates an optimum assignment in the context of the target function amongst all the permissible assignments of variables.

Integer linear optimization represents a global optimization approach, the models can be easily adapted and very good standard solvers exist (for example commercial computer programs such as Cplex® or Xpress®) which have proved themselves in many practical applications.

Further advantages of integer linear optimization:
Global optimization approach
Easily extended
For a solution that has been ascertained, it is known by how far away at most this is from the optimum solution.

Model

The method according to various embodiments has a plurality of target criteria, the purpose of which is to fit the constant tables KT1-KT4 such that subordinate methods based thereon
  target criterion 1: find a solution with as few setup groups as possible (determining the number of clusters (number of setup groups) for given constant tables), or
  target criterion 2: achieve the best possible production times with regard to line balancing of all the tables (determining setups for each cluster (setup group) for the remaining tables and also determining the cycle times of the lots).

The individual target criteria are weighted and linearly combined. In this situation, target criterion 1 or 2 can only be taken into consideration approximately: for example, a lower limit is minimized to the number of clusters to be expected and an attempt is made to also accommodate components on the constant tables KT1-KT4 which may be set up in multiple fashion in order to thus give the line balancer flexibility.

The methods for determining a minimum number of clusters (target criterion 1) or for the line balancing of all tables in order to achieve good production times (target criterion 2) are advantageously implemented by means of computer programs.

Optionally, immediately after determination of the setups for the constant tables KT1-KT4 a line balancing can be carried out for the constant tables obtained. By this means the setup for the constant tables KT1-KT4 is optimized, the steps for target criterion 1 or target criterion 2 can thus be executed more precisely and more quickly. A higher quality of solution (production time) is to be expected for target criterion 2.

The most important restrictions modeled by the linear equations and inequations and also the integrality conditions are as follows:

1. The predefined capacities of the constant tables KT1-KT4 are observed.
2. It must be possible to make setups for the minimal clusters and for all lots not contained in the minimal clusters, taking into consideration the setups of the constant tables.
3. For each constant table KT1-KT4, from the components set up there, taking into consideration potential multiple setups, there results a maximum number and a minimum number of components placed there. The approximated production times resulting therefrom are not permitted to deviate too far from the production time in the single lot case (limit).
4. The number of potential multiple setups should not become too great (limit).

In the course of developments, adjustments to the model may also be required.

In the model, with regard to the association of components with tables of the placement line it is assumed that constant tables have simple capacity and variable tables have infinite capacity.

Input

The method for determining setups for constant tables KT1-KT4 accepts input data (for describing the underlying infrastructure) and input parameters (serve to control the method).

Input data for the method comprises:
line description (automatic machines, heads, tables, permanently fitted components),
set of constant tables,
set of all lots including lot sizes,
set of component types (permissible heads, track width, MaxSetupCount),
set of minimal clusters,
a lower cycle time limit (cycle time, for instance the kiln cycle time, which must in any case be adhered to),
for each head and each lot, the core time,
for each lot or minimal cluster, the overall production time with regard to single lot optimization,
for each lot or minimal cluster and each head, the placement time with regard to single lot optimization,
for each lot or minimal cluster and each head, the number of placement positions set by this head with regard to single lot optimization.

The input parameters with which the method can be influenced by the user comprise:
the maximum filling level for the constant tables KT1 KT4,
the maximum filling level for the variable tables VT1-VT4,
maximum number of permitted increases in the MaxSetupCounts,
strategy for the method (algorithmic strategy): specification by the operator whether more emphasis is to be placed in the target function on the flexibility of the line balancing (and thus on reduced production times) or on minimizing the number of clusters. Possible values:
a) more emphasis on minimizing the number of clusters,
b) balanced distribution of the main focus of the optimization to number of clusters and overall production time,
c) more emphasis on minimizing the overall production time.
minimum cycle time:
this parameter makes it possible to take into consideration the fact that a particular cycle time must not be undershot (for example the kiln time),
time which the line balancer uses per lot for the balancing within the constant tables KT1-KT4 (see target criterion 2).

With regard to the method for determining setups for constant tables, the following default values have provided to be advantageous for the input parameters:
maximum filling level for the variable tables: 95%,
maximum filling level for the constant tables: 100%, (may be lower if after determining the setups for the constant tables the user carries out a line balancing for the constant tables obtained),
algorithmic strategy: balanced distribution of the main focus of the optimization to number of clusters and overall production time,
minimum cycle time: 0 s,
time which the line balancer uses per lot for the balancing within the constant tables: 1 min (one minute).

The lower the maximum permissible filling level for the constant or the variable tables, the more clusters tend to come into being (whereby, according to data availability, moderate reductions in the maximum permissible filling level naturally need not lead directly to an increase in the number of clusters). More clusters tend to lead to more flexibility of the line balancer and thus to reduced placement times.

If no optimization is carried out within the constant tables KT1-KT4 (optional step after determining the setups for the constant tables), then the advantage for the customer of a restriction in the filling level of the constant tables is to be seen only in a greater flexibility when subsequently including newly added products. If optimization takes place within the constant tables, then the flexibility achieved can be of advantage for the line balancer.

In some situations it may be necessary in order to achieve good production times to set up individual component types more frequently than permitted by the user (customer) through MaxSetupCount. If the customer is in agreement that in individual cases the MaxSetupCount can be increased by the method according to various embodiments, then the customer can predefine the maximum number of times this may occur. By entering the value "0", it is possible to generally prevent MaxSetupCounts being increased. (The method according to various embodiments minimizes the number of increases, therefore does not exceed the MaxSetupCounts more frequently than necessary.)

The target function of the method according to various embodiments is multicriterial (see target criterion 1, target criterion 2). The individual criteria are provided with weights which the user can influence to a restricted degree through the input parameters.

Output

The method according to various embodiments delivers
for each of the constant tables, the set of component types associated therewith,
a set of component types, for each of which the MaxSetupCount should be increased,
error messages, if any.

Performance

Integer linear optimization is used primarily for solving combinatorial optimization problems, which belong to the class of NP-hard problems, to which the present problem of determining setups for the constant tables KT1-KT4 also belongs. From the theoretical point of view, satisfactory reliable runtime specifications cannot be made for NP-hard problems.

The runtime of the method depends essentially on the number of possible associations of component types with constant tables KT1-KT4 (order of magnitude of the number of variables), but also on the concrete problem structure. From the practical point of view, experience gained to date with regard to the optimization of setups for constant tables KT1-KT4 for different plants shows that the method normally functions quickly and reliably. Solutions for entities whose order of magnitude and structure are in line with expectations. With regard to an example from one of the projects (approx. 1300 component types, 5 constant tables) the runtime for the method, implemented by a computer program on a commercially available personal computer or industrial PC, was a few minutes.

The greater the proportion of constant tables KT1-KT4 in a placement line BL, the more important does good balancing of the line within the constant tables KT1-KT4 become. If necessary, the balancing of the constant tables KT1-KT4 can be improved with the aid of a line balancer.

It may happen that as a result of the problem structure it is not possible to fit the predefined constant tables without for example losing the feasibility of one or more lots, or minimal clusters, for reasons of capacity. In this case, the method is unable to find a solution. An indication to the calling program that the problem cannot be solved occurs in this case.

The concept of the constant tables KT1-KT4 and the method for determining setups for constant tables KT1-KT4 are independent of the mounting technology used. In the automatic placement machines the components can thus be mounted on the printed circuit boards (boards) using through hole technology (THT), using surface mount technology (SMT) or using a hybrid technology. With regard to surface mount technology, the components are mounted flat onto the substrate and the electrical terminals are connected to the conductor paths. The components mounted flat on the surface are referred to as "surface mount devices" (SMD).

Implementation

The method according to various embodiments for determining constant tables can be executed as a computer program in a popular programming language (for example C++, Java etc.) and on popular computer systems (for example industrial PC, workstation etc.) having input/output units, processor and storage units. It is furthermore advantageous to store the method according to various embodiments as a software program on a computer-readable medium (diskette, DVD, CD, USB stick, memory card etc.). This means that the method according to various embodiments can be marketed very easily as a product. In principle, this product can also be distributed or marketed over the internet.

Method for determining setups for constant tables of automatic placement machines in placement lines at predefined table locations by means of mixed integer linear optimization on the basis of input data describing the placement infrastructure and input parameters which can be predefined by the operator or user. The method can be used regardless of the mounting technology used (for example through hole technology, surface mount technology or a hybrid technology). The method can advantageously be employed if further methods are based thereon, such as for example cluster methods for setup group formation or line balancing for cycle time optimization.

What is claimed is:

1. A method for determining setups for constant tables of automatic placement machines in placement lines at predefined table locations, the method comprising:
   using setups of constant tables in all setup groups, whereby a setup group comprises a set of lots which are manufactured within a setup, and
   executing computer instructions stored in non-transitory computer readable medium using a processor, to automatically calculate the setups for the constant tables by mixed integer linear optimization based on input data and input parameters, wherein the input parameters comprise:
   a maximum filling level for the constant tables;
   a maximum filling level for variable tables; and
   a maximum number of permitted increases in MaxSetupCounts.

2. The method according to claim 1, wherein the input data comprises the following data describing placement infrastructure of the placement lines:
   tables with number of free tracks,
   locations of the constant tables,
   components with placement position numbers,
   maximum setup numbers per component,
   possible associations of components with tables,
   track requirements of the components on the tables,
   cycle times and placement position numbers per placement head in a result ascertained from a single lot optimization.

3. The method according to claim 2, wherein a minimum cycle time limit is predefined as a further input data item, describing the placement infrastructure, for the calculation of the setups.

4. The method according to claim 1, further comprising the following step:
   determining setup groups based on the calculated setups for the constant tables.

5. The method according to claim 1, further comprising the following step:
   determining the setups for additional tables in the placement line for each setup group.

6. The method according to claim 1, wherein the input parameters further comprise an optimization strategy of a user.

7. The method according to claim 1, further comprising providing a user interface for predefining values for the input parameters.

8. A computer software product comprising a non-transitory computer readable medium storing instruction which when executed on a program-controlled facility control automatic placement machines in placement lines at predefined table locations,
   wherein setups of constant tables are used in all setup groups,
   wherein a setup group comprises a set of lots which are manufactured within a setup, and
   wherein the program-controlled facility calculates the setups for the constant tables by mixed integer linear optimization based on input data and input parameters, the input parameters comprising:
   a maximum filling level for the constant tables;
   a maximum filling level for variable tables; and
   a maximum number of permitted increases in MaxSetupCounts.

9. The computer software product according to claim 8, wherein the input data comprises the following data describing placement infrastructure of the placement lines:
   tables with number of free tracks,
   locations of the constant tables,
   components with placement position numbers,
   maximum setup numbers per component,
   possible associations of components with tables,
   track requirements of the components on the tables,
   cycle times and placement position numbers per placement head in a result ascertained from a single lot optimization.

10. The computer software product according to claim 9, wherein a minimum cycle time limit is predefined as a further input data item, describing the placement infrastructure, for the calculation of the setups.

11. The computer software product according to claim 8, wherein the automatic placement machine is further configured to determine setup groups based on the calculated setups for the constant tables.

12. The computer software product according to claim 8, wherein the automatic placement machine is further configured to determine the setups for additional tables in the placement line for each setup group.

13. The computer software product according to claim 8, wherein the input parameters further comprise an optimization strategy of a user.

14. The computer software product according to claim 8, wherein values for the input parameters are predefinable via a user interface associated with the automatic placement machine.

15. An automatic placement machine, comprising:
a constant table,
wherein a location of the constant table in a placement line comprising setup groups is predefined, whereby setups of the constant table are used in all setup groups of the placement line,
wherein a setup group includes a set of lots which are manufactured within the same setup, and
wherein the setups for the constant table are determined by calculating the setups for the constant tables by mixed integer linear optimization based on input data and input parameters, the input parameters comprising:
a maximum filling level for the constant tables;
a maximum filling level for variable tables; and
a maximum number of permitted increases in MaxSetupCounts.

16. The automatic placement machine according to claim 15, wherein the input data comprises the following data describing placement infrastructure of the placement lines:
tables with number of free tracks,
locations of the constant tables,
components with placement position numbers,
maximum setup numbers per component,
possible associations of components with tables,
track requirements of the components on the tables,
cycle times and placement position numbers per placement head in a result ascertained from a single lot optimization.

17. The automatic placement machine according to claim 16, wherein a minimum cycle time limit is predefined as a further input data item, describing the placement infrastructure, for the calculation of the setups.

18. The automatic placement machine according to claim 15, wherein the automatic placement machine is further configured to determine setup groups based on the calculated setups for the constant tables.

19. The automatic placement machine according to claim 15, wherein the automatic placement machine is further configured to determine the setups for additional tables in the placement line for each setup group.

20. The automatic placement machine according to claim 15, wherein the input parameters further comprise an optimization strategy of a user.

* * * * *